US012749872B2

(12) United States Patent
Xu et al.

(10) Patent No.: US 12,749,872 B2
(45) Date of Patent: Sep. 29, 2026

(54) RIDGE WAVEGUIDE LASER WITH DIELECTRIC CURRENT CONFINEMENT

(71) Applicant: Applied Optoelectronics, Inc., Sugar Land, TX (US)

(72) Inventors: Dapeng Xu, Houston, TX (US); Huanlin Zhang, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 1175 days.

(21) Appl. No.: 17/500,248

(22) Filed: Oct. 13, 2021

(65) Prior Publication Data

US 2023/0112885 A1 Apr. 13, 2023

(51) Int. Cl.

| | |
|---|---|
| ***H01S 5/22*** | (2006.01) |
| ***H01S 5/02*** | (2006.01) |
| ***H01S 5/227*** | (2006.01) |
| ***H01S 5/32*** | (2006.01) |
| ***H01S 5/343*** | (2006.01) |
| ***H04B 10/50*** | (2013.01) |

(52) U.S. Cl.

CPC .............. *H01S 5/2205* (2013.01); *H01S 5/22* (2013.01); *H01S 5/2214* (2013.01); *H04B 10/504* (2013.01); *H01S 5/0202* (2013.01); *H01S 5/227* (2013.01); *H01S 5/3202* (2013.01); *H01S 5/343* (2013.01); *H01S 2301/176* (2013.01); *H04B 10/506* (2013.01)

(58) Field of Classification Search

CPC ........ H01S 5/2205; H01S 5/22; H01S 5/2214; H01S 5/0202; H01S 5/227; H01S 5/3202; H01S 5/343; H01S 2301/176

See application file for complete search history.

(56) References Cited

U.S. PATENT DOCUMENTS 5,390,205 A * 2/1995 Mori ........................ H01S 5/227 372/46.01

5,493,577 A * 2/1996 Choquette ........... H01S 5/18313 372/99

5,633,527 A * 5/1997 Lear ................... G02B 6/12004 372/50.23

(Continued)

OTHER PUBLICATIONS

G.P. Agrawal, W.B. Joyce, R.W. Dixon, and M. Lax, "Beampropagation analysis of stripegeometry semiconductor lasers: Threshold behavior", Applied Physics Letters 43, 11 (1983); doi: 10.1063/1.94138, 4 pgs.

*Primary Examiner* — M. A. Golub-Miller

(74) *Attorney, Agent, or Firm* — Secant IP, P.L.L.C.

(57) ABSTRACT

An aspect of the present disclosure includes a direct modulated laser (DML) with a dielectric current confinement ridge waveguide (RWG) structure. The DML comprises a substrate, one or more layers of material disposed on the substrate to provide a multi quantum well (MQW), first and second insulation/dielectric structures disposed on opposite sides of the MQW, and one or more layers of material disposed on the MQW to provide a mesa structure for receiving a driving current. The mesa structure is preferably disposed between the first and second insulation structures to provide a dielectric current confinement (RWG) structure. The mesa structure further preferably includes an overall width that is greater than the overall width than the active region of the DML that provides the MQW.

13 Claims, 10 Drawing Sheets

(56) References Cited

U.S. PATENT DOCUMENTS

| | | | | |
|---|---|---|---|---|
| 7,943,942 | B2 * | 5/2011 | Jiang | H10H 20/84<br>257/97 |
| 9,040,322 | B2 * | 5/2015 | Sato | H10H 20/01<br>438/42 |
| 12,136,796 | B2 * | 11/2024 | Xu | H01S 5/026 |
| 2002/0187579 | A1 * | 12/2002 | Kubota | H01S 5/2231<br>438/43 |
| 2004/0057646 | A1 * | 3/2004 | Berry | H01S 5/026<br>385/12 |
| 2007/0217458 | A1 * | 9/2007 | Kitano | H01S 5/2231<br>372/43.01 |
| 2007/0274359 | A1 * | 11/2007 | Takeuchi | B82Y 20/00<br>372/46.01 |
| 2009/0213884 | A1 * | 8/2009 | Rosso | H01S 5/0265<br>438/31 |
| 2020/0326476 | A1 * | 10/2020 | Hiratani | H01S 5/2275 |
| 2021/0044088 | A1 * | 2/2021 | Murayama | H10H 20/816 |
| 2021/0210930 | A1 * | 7/2021 | Lin | H01S 5/0234 |
| 2023/0053516 | A1 * | 2/2023 | Xu | H01S 5/026 |
| 2023/0411931 | A1 * | 12/2023 | Xu | H01S 5/2275 |

* cited by examiner (CONVENTIONAL STRUCTURE)

RIDGE WAVEGUIDE LASER WITH DIELECTRIC CURRENT CONFINEMENT

TECHNICAL FIELD

The present disclosure relates generally to optical devices, and more particularly, to a direct modulated laser (DML) for use within optical subassemblies with a dielectric current confinement ridge waveguide structure.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher transmit/receive speeds in increasingly space-constrained optical transceiver modules has presented challenges, for example, with respect to thermal management, insertion loss, RF driving signal quality and manufacturing yield.

Optical transceiver modules generally include one or more transmitter optical subassemblies (TOSAs) for transmitting optical signals. TOSAs can include one or more lasers to emit one or more channel wavelengths and associated circuitry for driving the lasers. DML-type lasers are particularly well suited for applications that seek to reduce power consumption and/or maintain a relatively small overall footprint. However, scaling of DMLs and the desire to reach production bandwidths of greater than 35 GHz for 100 Gbps per lambda (single lane) transmission, for example, raises numerous non-trivial challenges.

BRIEF DESCRIPTION OF THE DRAWINGS

These and other features and advantages will be better understood by reading the following detailed description, taken together with the drawings wherein.

DETAILED DISCLOSURE

Figure 1:
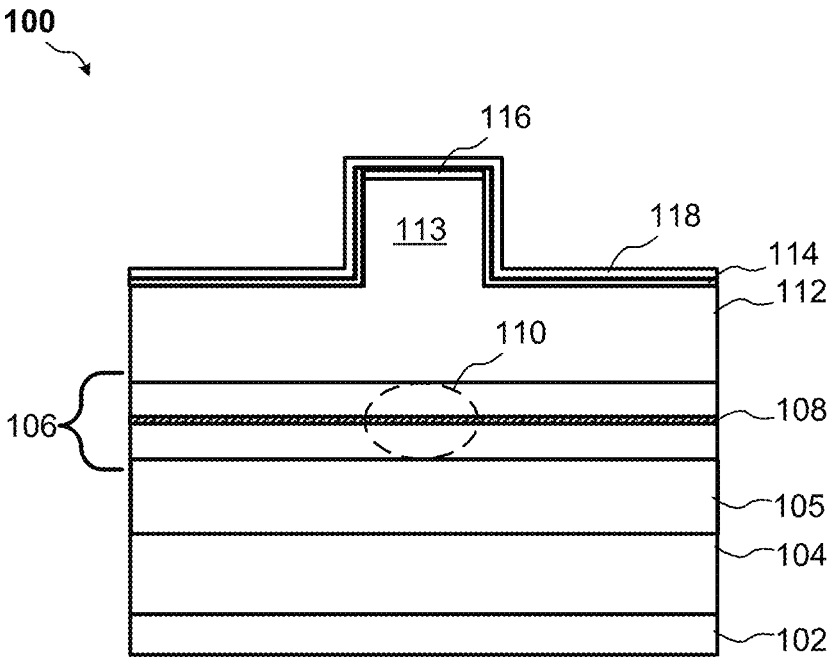
FIG. 1 shows an example direct modulated laser (DML) device.

Frequency response of a semiconductor laser establishes the maximum production bandwidth. Frequency response of a directly modulated laser can be determined by the following equation:

$$|R(f)| = \frac{f_r^2}{\left(\left(f^2 - f_r^2\right)^2 + \frac{f^2\gamma^2}{(2\pi)^2}\right)^{\frac{1}{2}}} \frac{1}{\left(1 + (2\pi f CR)^2\right)^{\frac{1}{2}}} \qquad \text{Equation (1)}$$

Where (fr) is the relaxation oscillation frequency, (γ) is the damping coefficient (∝Kfr$^2$), (C) is capacitance, (K) is the bandwidth factor and (R) is resistance.

With this in mind, it is understood that limiting factors of bandwidth include, for example, the relaxation oscillation frequency (~1.55 fr), damping (~8.89/K), and CR time constant (~1/(2πCR)).

The proportional impact on frequency response (fr) by such factors can be defined by the following equation:

$$f_r \propto \left(\frac{\Gamma\frac{dg}{dn}}{LWN_wL_w}(I - I_{th})\right)^{\frac{1}{2}} \qquad \text{Equation (2)}$$

Where (Γ) is the optical confinement factor, (L) is the active region length, ($N_w$) is the number of quantum wells, (I) is the injection current, (dg/dn) is the differential gain, (W) is the active region width, ($L_w$) is the quantum well thickness, and $I_{th}$ is the threshold current.

Therefore, one approach to increasing frequency response for a semiconductor laser is to decrease the length (L) and/or width (W) of the active region, which is to say decrease the volume of the cavity that defines the active area. However, reducing the active region volume can lead to degraded laser performance because cleaving yield can drop significantly with an optical cavity length less than 100 microns.

Alternatively, or in addition, the width of the mesa can be reduced which has the net effect of active region volume reduction. However, narrowing the mesa and/or having a relatively shortened cavity, e.g., based on reducing (L) and (W) of the active region, can cause increased resistance and thus degraded laser performance because resistance is inverse to surface area (L*W). In the context of ridge waveguide (RWG) DML lasers, this can introduce current spreading, higher optical scattering loss, and lower optical confinement and thus high threshold current density as well as high resistance (and resulting heat). High threshold current density can result in a significant percentage of threshold current failing to contribute to active region pumping and lower overall efficiency of the laser.

Thus, and in accordance with aspects of the present disclosure, a DML laser is disclosed with a dielectric current confinement ridge waveguide (RWG) structure. In more detail, the DML can include a mesa structure having an overall width that is in a range of 1.3 to 2.5 microns, or at least 1.5±0.2 microns. More preferably, the DML has a mesa structure with an overall width that is greater than the overall width (W) of the active region of the DML. The DML is preferably formed via selective area regrowth using metalorganic chemical vapor deposition process (MOCVD). The DML is also further preferably formed using a substrate formed from a P-doped semiconductor material such as Indium Phosphide (InP), although other material and material configurations are within the scope of this disclosure.

A DML having a dielectric current confinement (RWG) structure consistent with the present disclosure provides numerous advantages over other DML configurations. For example, the increased mesa width minimizes or otherwise reduces current spreading. Moreover, the increased mesa width can reduce electrical resistance for the circuit. Increased optical confinement can be achieved through relatively increased confinement of light within the active region, as well as increased thermal conductivity due to a relatively wider top mesa on the active region. Utilizing a p-type substrate can also further reduce electrical resistance.

In addition, formation of a DML consistent with the present disclosure can utilize one-step growth via a selective area growth process, thus eliminating the necessity of dry or wet etching during fabrication. This can result in laser surfaces which do not include the defects normally caused by such etching processes. Due to a mass transport process, the MOCVD growth of top cladding layer of InP, for example, can introduce a relatively thin InP passivation layer for protection of the active region surface. The resulting DML may therefore have a so-called "defect free" surface and can include a relatively thin passivation layer that can improve overall reliability of the DML. The surface defects close to the active region is one significant area that can contribute to the failure/degradation of a DML.

In one specific example consistent with the present disclosure a DML is disclosed. The DML comprises a substrate, one or more layers disposed on the substrate to provide a multi quantum well (MQW), first and second insulation structures disposed on opposite sides of the MQW, and one or more layers disposed on the MQW to provide a mesa structure for receiving a driving current. The mesa structure is preferably disposed between the first and second insulation layers to provide a dielectric current confinement (RWG) structure.

The term "coupled" as used herein refers to any connection, coupling, link or the like between elements and "optically coupled" refers to coupling such that light from one element is imparted to another element. Such "coupled" devices are not necessarily directly connected to one another and may be separated by intermediate components or, in the context of optical coupling, devices that may manipulate or modify such signals. On the other hand, the term "direct" in the context of coupling/connecting refers to coupling between elements that does not include intermediate elements such as an intervening layer of material. Note, the term "disposed on" in the context of material layers disclosed herein refers to a first material layer that can be directly disposed on a second material layer (e.g., without an intervening intermediate layer disposed therebetween) or indirectly on the second material layer.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise provided by the present disclosure.

FIG. 1 shows an example DFB laser 100 that includes a conventional structure. The DFB laser 100 includes an N-contact layer 102 that can comprise Gold (Au), for example. A substrate layer 104 is disposed on the N-contact layer 102. The substrate layer 104 can comprise Indium Phosphide (InP). A lower cladding layer 105 is disposed on the substrate layer 104. The lower cladding layer 105 can comprise N-doped InP, for example. An active region 106 is formed from a plurality of layers disposed on the lower cladding layer 105. The active region 106 includes upper and lower material layers to provide a waveguide core and an MQW 108 disposed therebetween to emit laser light 110. An upper cladding layer 112 is disposed on the active region 106. The upper cladding layer 112 can provide a mesa structure 113. An isolation layer 114 is disposed on the upper cladding layer 112. The isolation layer 114 can comprise Silicon Dioxide ($SiO_2$), for example. A p-type cap 116 is disposed on the isolation layer 114. A p-type contact layer 118 is disposed on the isolation layer 114 and the p-type cap 116. The mesa structure 113 includes an overall width that is equal to or less than the width of the active region 106, and more specifically, the MQW 108. This configuration of the DFB laser 100 may also be referred to as a narrow mesa configuration/structure.

The active region 106 of the DFB laser 100 includes an overall length of 100 microns or greater. As is known, and as discussed above, reducing the length of the active region 106 below 100 microns reduces the cleaving yield. Likewise, reducing the overall volume of the active region and utilizing a narrow mesa causes higher resistance, current spreading, optical scattering loss and reduced/lowered optical confinement.

Figure 2:
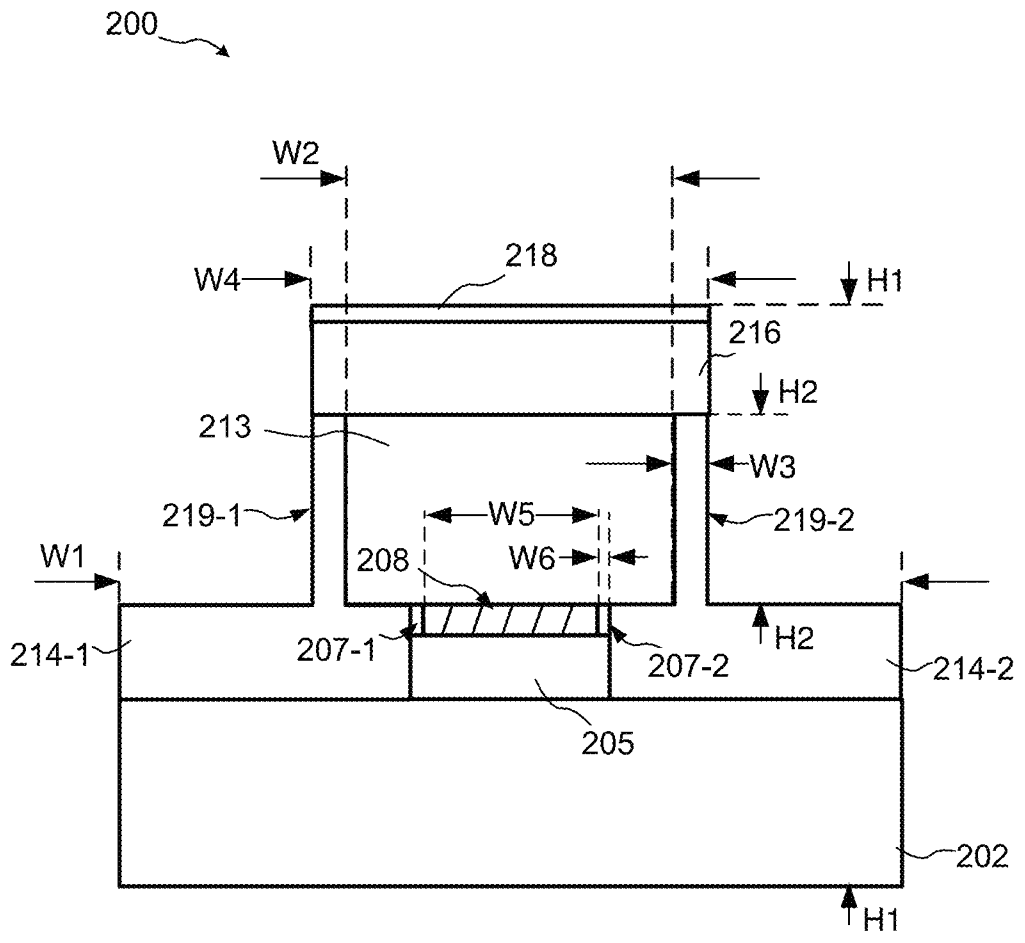
FIG. 2 shows an example DML consistent with aspects of the present disclosure.

FIG. 2 shows an example DML 200 consistent with aspects of the present disclosure. As shown, the DML 200 can include a similar configuration to that of the DML shown in FIG. 1, the description of which will not be repeated for brevity. However, and as discussed further below, the DML 200 includes a dielectric current confinement ridge waveguide structure to provide an increased frequency response.

As shown, the DML 200 includes a substrate 202. Preferably, first and second dielectric structures 214-1, 214-2 are disposed on the substrate 202. The DML 200 further preferably includes a lower cladding 205 disposed on the substrate 202. More preferably, the lower cladding 205 is disposed on the substrate 202 between the first and second dielectric structures 214-1, 214-2.

As further shown, the DML 200 further preferably includes an MQW 208 disposed on the lower cladding 205. The MQW 208 is preferably formed via one or a plurality of layers of material. More preferably, the MQW 208 is disposed on the lower cladding 205 and between the first and second dielectric structures 214-1, 214-2. In addition, the DML 200 further preferably includes first and second sidewall passivation layers 207-1, 207-2. The first and second sidewall passivation layers 207-1, 207-2 are preferably disposed on opposite sides of the MQW 208 and are disposed between the first and second dielectric structures 214-1, 214-2.

The first and second dielectric structures 214-1, 214-2 preferably include a base section, which may also be referred to herein as simply a base. First and second vertical sections 219-1, 219-2 preferably extend from each respective base. The first and second vertical sections 219-1, 219-2 are preferably formed with corresponding first and second dielectric structures 214-1, 214-2 as a single, monolithic structure/piece. The first and second vertical sections 219-1, 219-2 may also be referred to herein as current confinement structures or simply confinement structures. The first and second dielectric structures 214-1, 214-2 and the first and second vertical sections 219-1, 219-2 preferably extend along the entire longitudinal length of the DML 200.

As further shown, the DML 200 further preferably includes a mesa structure 213 disposed on the MQW 208. The mesa structure 213 is preferably formed from one or a plurality of layers of material. Further, the mesa structure 213 is preferably disposed on the MQW 208 and is disposed between the first and second vertical sections 219-1, 219-2 such as shown. More preferably, this configuration also includes at least a portion of the first and second dielectric structures 214-1, 214-2 underlying and supporting the mesa structure 213.

The DML 200 further preferably includes a cap 216 disposed on the mesa structure 213, and more preferably, the cap 216 is disposed on the mesa structure 213 and the first and second vertical sections 219-1, 219-2. A contact layer 218 is preferably disposed on the cap 216.

The substrate 202 preferably comprises a material such as Indium Phosphide (InP). However, the substrate 202 can comprise other materials such as Gallium Arsenide (GaAs), Gallium Antimonide (GaSb), and/or Indium Arsenide (InAs), for example. The material providing the substrate 202 may be n-type or p-type depending on a desired configuration. The substrate 202 preferably comprises a thickness in a range of 300 to 700 microns (um).

The first and second dielectric structures 214-1, 214-2 preferably comprise a dielectric material such as $SiO_2$, although other materials such as Silicon Nitride (SiNx) are within the scope of this disclosure. The portion of the first and second dielectric structures 214-1, 214-2 that underlies the mesa structure 213, which is to say the base section, preferably has an overall thickness in a range of 1500 to 3000 A. The base section of each of the first and second dielectric structures 214-1, 214-2 is further preferably configured with a width that is greater than the width of the respective vertical sections. The width of the base sections is preferably in a range of 150 to 300 microns. The first and second vertical sections 219-1, 219-2 preferably extend from the respective base of the first and second vertical sections 219-1, 219-2 to an overall height H2 that is in a range of 1.2 to 2 microns.

The lower cladding 205 preferably comprises a material such as InP. The lower cladding 205 preferably include a thickness in a range of 200 to 2000 A.

The MQW 208 preferably comprises a group III-V semiconductor material. Some such example materials include Indium Gallium Arsenide (InGaAs), Indium Gallium Arsenide Phosphide (InGaAsP), Indium Gallium Arsenide Antimonide (InGaAsSb) although other alloys are within the scope of this disclosure. The MQW 208 preferably includes a thickness in a range of 500 to 5000 A.

The first and second sidewall passivation layers 207-1, 207-2 preferably comprise a material such as InP. The first and second sidewall passivation layers 207-1, 207-2 are preferably provided via mass transport to provide active region sidewall passivation. The first and second sidewall passivation layers 207-1, 207-2 preferably include an overall thickness in a range of 100 to 500 A.

The mesa structure 213 preferably comprises a material such as InP. The mesa structure 213 is preferably formed via MOCVD, and preferably, using selective area growth to provide a one-step fabrication method, as discussed in greater detail below. The mesa structure 213 preferably includes a thickness in a range of 1.2 to 2 um. More preferably, the mesa structure 213 includes a thickness that causes the mesa structure 213 to extend from the first and second dielectric structures 214-1, 214-2 to an overall height equal to the overall height H2.

The overall width W1 of the DML 200 is preferably in a range of 150 to 300 microns. The overall width W2 of the mesa structure 213 is in a range of 1.2 to 2.5 microns, and more preferably 1.8±0.5 microns. The overall length of the DML 200 is preferably in a range of 100 to 200 microns.

Each of the first and second vertical sections 219-1, 219-2 include an overall width W3 that is preferably in a range of 2000 to 6000 A. The overall width W4 of the mesa structure 213 and the first and second vertical sections 219-1, 219-2 is therefore in a range of 1.6 to 3 microns.

The MQW 208 preferably includes an overall width W5 in a range of 0.7 to 1.5 microns. The first and second sidewall passivation layers 207-1, 207-2 preferably include an overall width W6 in a range of 100 to 500 A. Preferably, the overall length of the MQW 208 is equal to the overall (longitudinal) length of the DML 200. Accordingly, this preferably results in the MQW 208 having an overall volume in a range of 16 to 120 um^3.

Preferably, the overall width W2 of the mesa structure 213 is greater than the overall width W5 of the MQW 208. In one specific example, the overall width W2 of the mesa structure 213 relative to the overall width W5 of the MQW 208 is a ratio of 1.8:1.

Figure 3A:
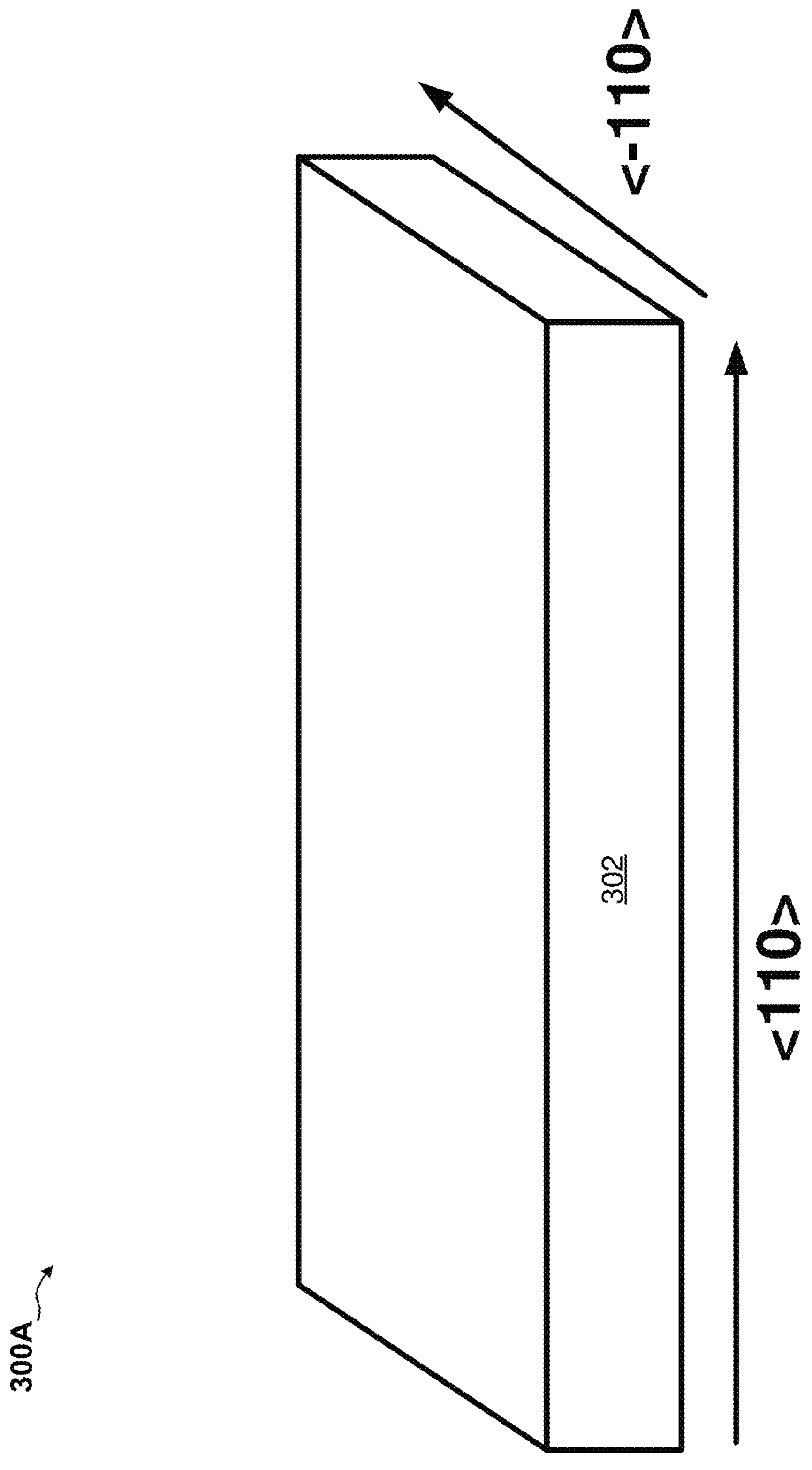
FIG. 3A illustrates one example crystallographic orientation suitable for use in a DML fabrication process consistent with the present disclosure.

The example 300A of FIG. 3A shows one example process for forming a DML consistent with the present disclosure using MOCVD selective growth. As shown, the process begins with receiving a substrate 302. The substrate 302 preferably comprises InP. However, the substrate 302 can comprise other materials such as GaAs, GaSb, and/or InAs.

Figure 3B:
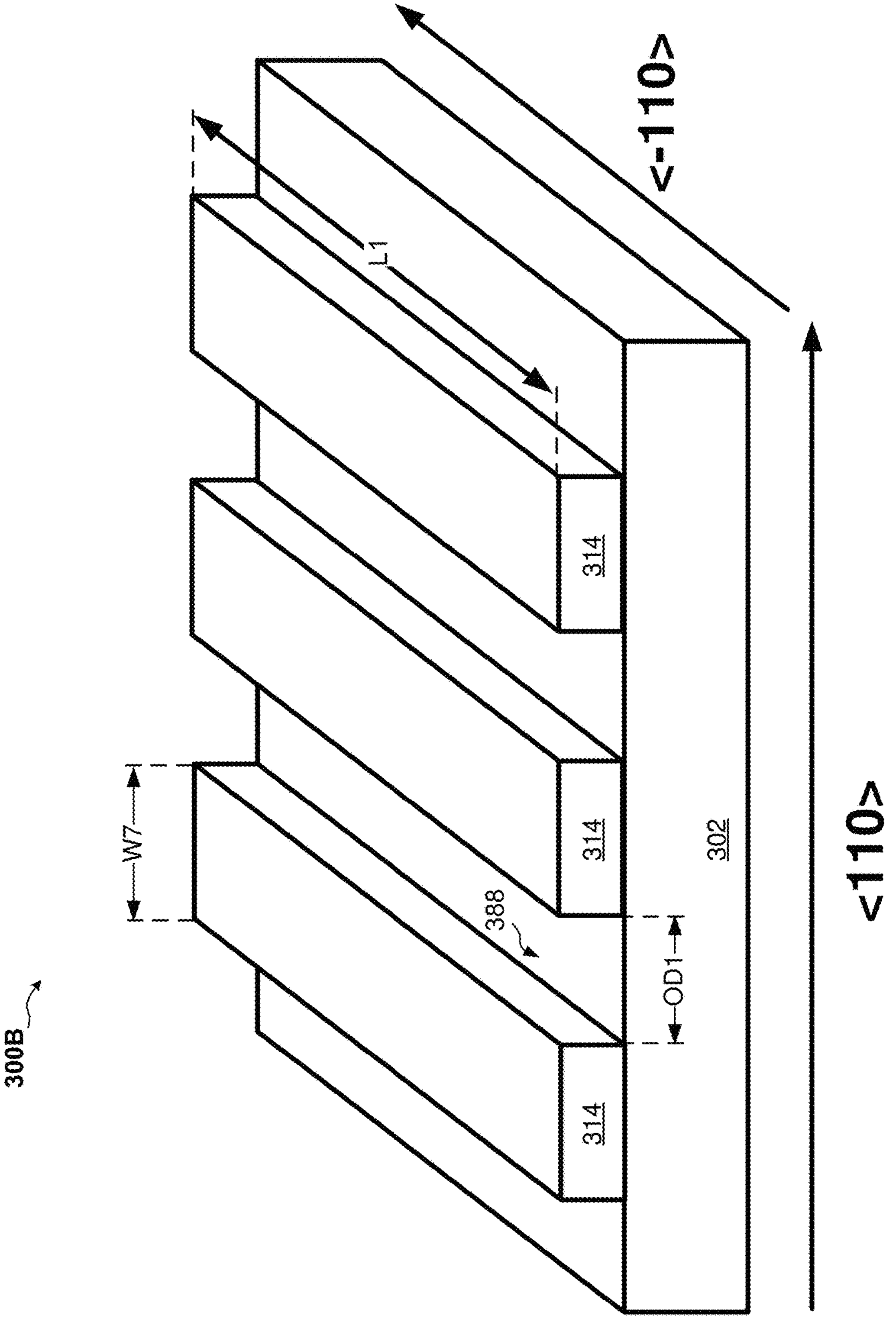
FIG. 3B shows a plurality of narrow dielectric stripes grown on the substrate in the crystallographic orientation shown in FIG. 3A, in accordance with aspects of the present disclosure.

As shown in example 300B of FIG. 3B, the process further preferably includes formation of a plurality of narrow dielectric stripes 314 disposed on the (001) surface plane 388 of the substrate 302. The plurality of narrow dielectric stripes 314 are preferably aligned along, and extend substantially parallel with, the <−110> crystallographic direction of the substrate 302. The narrow dielectric stripes 314 are preferably formed from a material such as SiO2.

The plurality of narrow dielectric stripes 314 are preferably formed/disposed on the substrate 302 via narrow stripe selective MOCVD. Each of the plurality of narrow dielectric stripes 314 are formed with an overall width W7. The overall width W7 of each of the plurality of narrow dielectric stripes 314 is preferably uniform. The overall width W7 is preferably in a range of 3.0 to 5.0 microns, and more preferably 4.0±0.5 microns. Each of the plurality of narrow dielectric stripes 314 further preferably include an overall thickness in a range of 1000 to 5000 A. The overall thickness of each of the plurality of narrow dielectric stripes 314 is preferably uniform.

The overall length L1 of each of the plurality of narrow dielectric stripes 314 is preferably in a range of 100 to 300 microns. The overall length L1 of each of the plurality of narrow dielectric stripes 314 is preferably uniform. More preferably, the overall length L1 of each of the plurality of narrow dielectric stripes 314 is preferably equal to the overall length of the substrate 302, such as shown in FIG. 3B. As further shown, each of the plurality of narrow dielectric stripes 314 are preferably disposed at an overall offset distance OD1. The overall offset distance OD1 between each of the narrow dielectric stripes 314 is preferably uniform. The overall offset distance OD1 preferably measures within a range of 0.5 and 2.0 microns, and more preferably 1.0±0.5 microns.

Figure 3C:
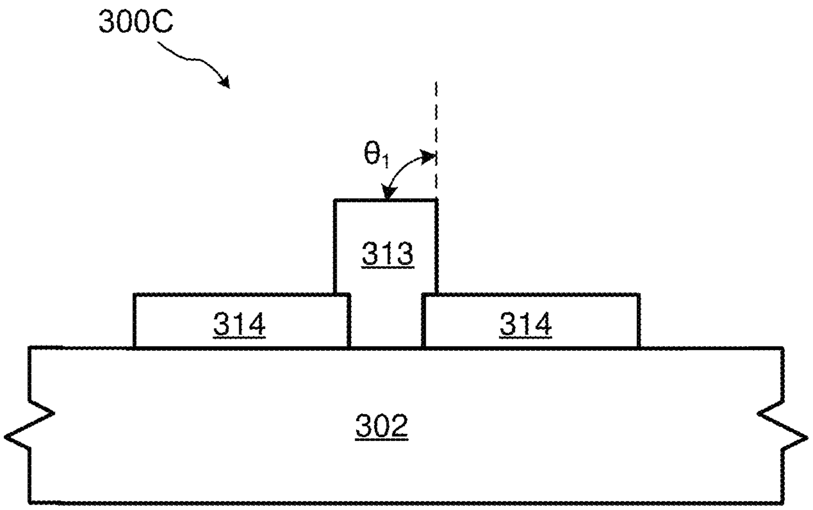
FIG. 3C shows a mesa structure grown on the substrate in the crystallographic orientation shown in FIGS. 3A-B, in accordance with aspects of the present disclosure.

As shown in example 300C of FIG. 3C, the process continues with formation of a mesa structure 313. The mesa structure 313 preferably comprises a material such as InP. As further shown, the mesa structure 313 includes a first facet angle ($\theta_1$) relative to the (001) surface plane of the substrate 302, with $\theta_1$ preferably measuring in a range of 80-95 degrees, and more preferably 90±1.0 degrees.

The process may then continue with deposition/epitaxial growth of InGaAs to form a DML consistent with the present disclosure. The wafer can then be processed into a RWG laser using semiconductor laser processing steps. One such example will now be provided for purpose of illustration and not limitation.

First, a dielectric layer, e.g., formed from $SiO_2$ or SiNx, with a thickness of 2000 A to 5000 A, is deposited on the wafer using plasma enhanced chemical vapor deposition (PECVD) method for electrically isolating the laser ridge to the rest of the device. Next, the dielectric layer on top of the mesa ridge can be exposed by photolithography with photoresist as mask material, and can be subsequently etched away using wet chemical etch or plasma enhanced dry etch method, for example. The top metal contact layers, e.g., formed from Ti, Pt, or Au, can then be formed on top of the mesa with either electron beam evaporation, sputtering, and/or electroplating. The wafer backside may then be thinned down/reduced to a final thickness of 70 um to 100 um by a lapping and polishing process, for example. Next, the backside metal contact, e.g., formed of Ti, Pt, or Au, may then be deposited using a similar method to that of the top metal contact formation. The wafer may then be annealed to form a ohmic or a Schottky contact by a rapid thermal annealing (RTA) process. The wafer can then be cleaved along the crystal orientation to form laser diode bars. The laser diode bars may be further coated with antireflection dielectric coating in the front facet and high reflectivity dielectric coating in the back facet using ion beam sputtering or electron beam evaporation method, for example. The laser bar can be further singulated to individual laser chips or multiple chip arrays after electrical and optical characterizations.

Figure 4A:
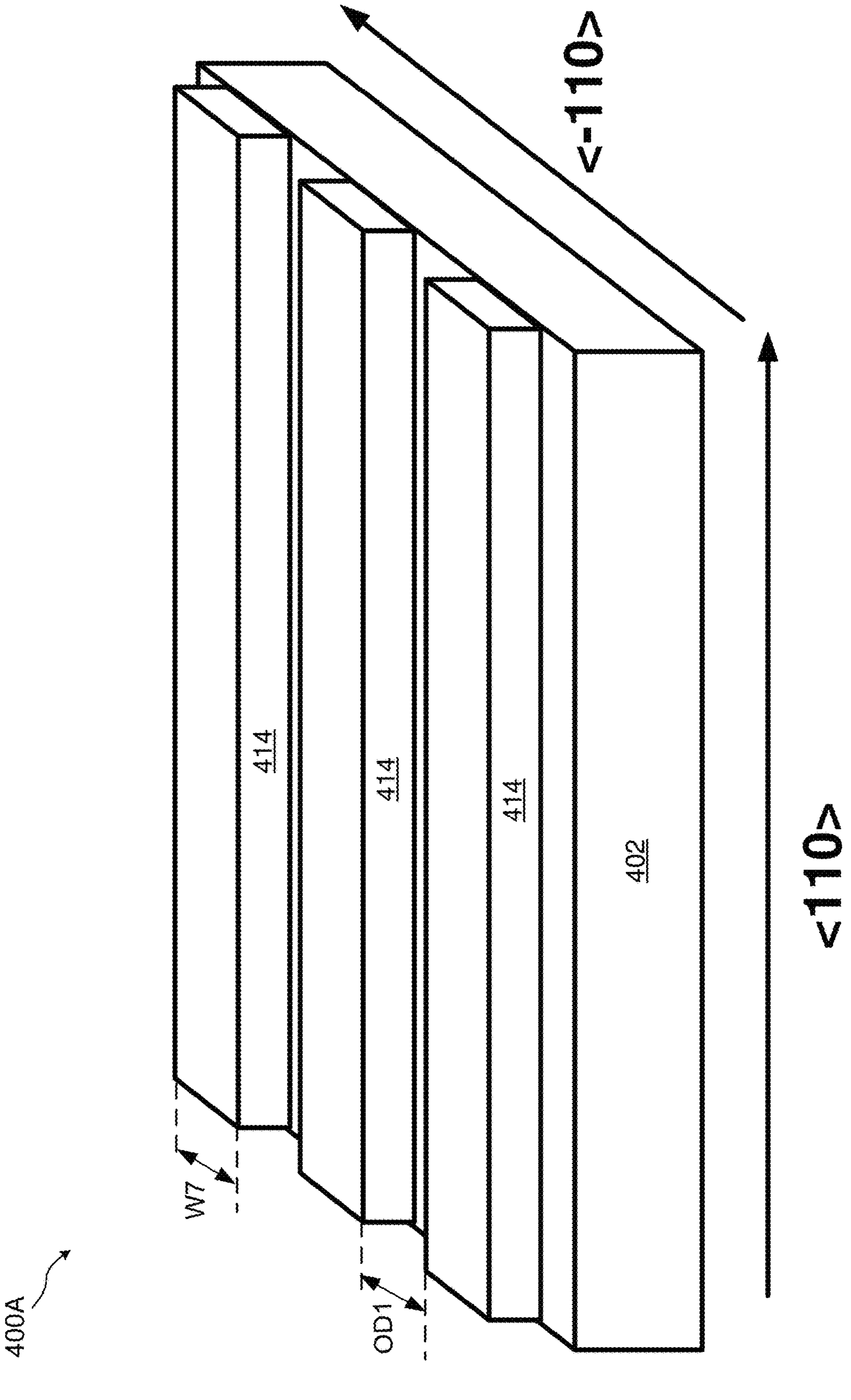
FIG. 4A illustrates another example crystallographic orientation suitable for use in a DML fabrication process consistent with the present disclosure.

FIG. 4A shows another example 400A of a process for forming a DML consistent with aspects of the present disclosure. The process of FIG. 4A is substantially similar to the process discussed above with regard to FIGS. 3A-3C, the description of which is equally applicable to FIG. 4A and for this reason will not be repeated for brevity. However, as shown in FIG. 4A, the plurality of narrow dielectric stripes 414 can be aligned on the substrate 402 substantially transverse relative to the <−1 1 0> crystallographic direction of the substrate 402. More preferably, the plurality of narrow dielectric stripes 414 extend perpendicular relative to the <−1 1 0> crystallographic direction of the substrate 402.

Figure 4B:
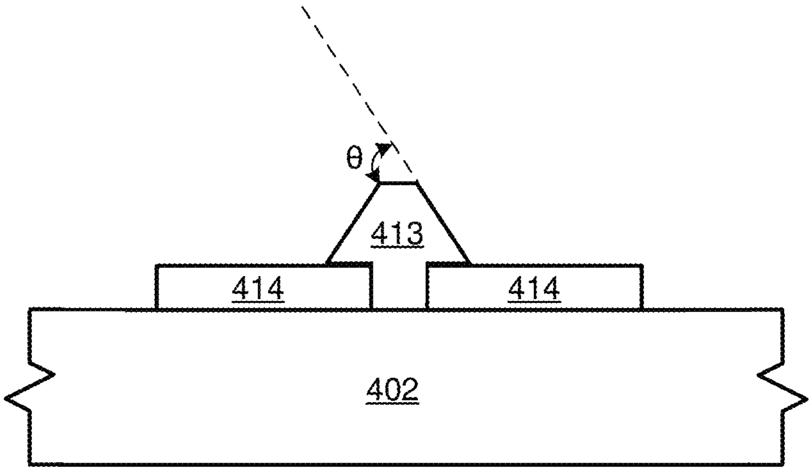
FIG. 4B shows a mesa structure grown on the substrate in the crystallographic orientation shown in FIG. 4A, in accordance with aspects of the present disclosure.

As shown in FIG. 4B, the process may then continue with formation of the mesa structure 413 using MOCVD selective growth. MOCVD growth substantially transverse to the <−1 1 0> crystallographic direction of the substrate 402 can result in the mesa structure 413 having a second facet angle $\theta_2$, with $\theta_2$ preferably measuring in a range of 35-45 degrees, and more preferably 37±1.0 degrees, relative to the surface of the substrate 402. The mesa structure 413 of FIG. 4B may also be described as having an obtuse facet angle.

Figure 5:
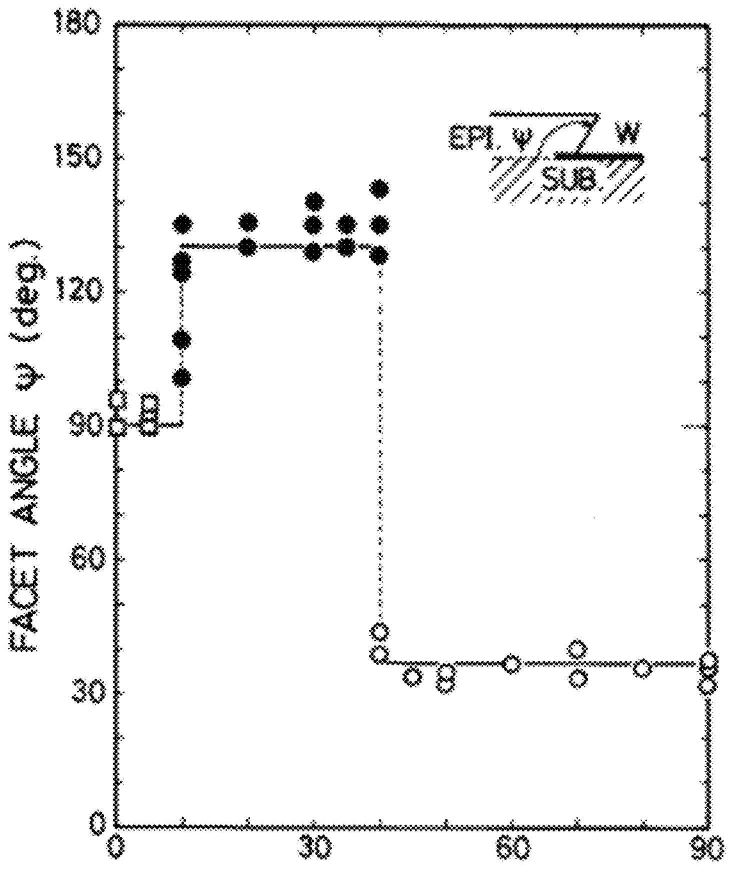
FIG. 5 is a graph that plots the resulting facet angle for a mesa structure with respect to the (001) surface plane of an underlying substrate as a function of the stripe angle from the <−1 1 0> crystallographic orientation.

FIG. 5 shows a graph that illustrates resulting facet angle (in degrees) as a function of the stripe angle relative to the <−1 1 0> crystallographic direction for a given substrate.

Figure 6:
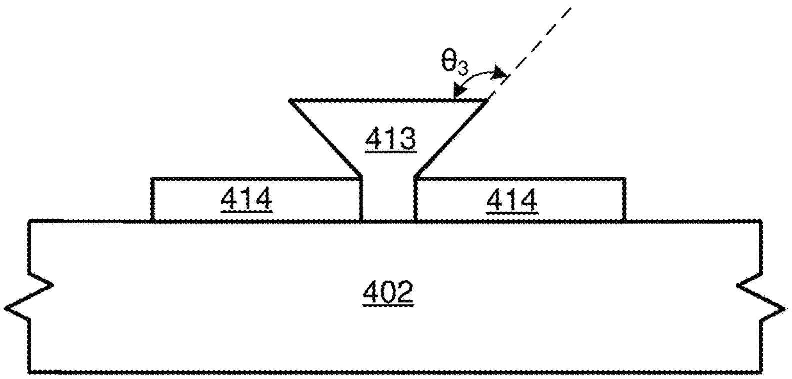
FIG. 6 shows another example mesa structure grown on the substrate in the crystallographic orientation shown in FIG. 4A, with the mesa structure having a predetermined facet angle relative to the (001) surface plane.

As shown in FIG. 6, a third facet angle ($\theta_3$) for the mesa structure 413 can be achieved based on varying the stripe angle relative to the <−1 1 0> crystalline direction as shown in the graph of FIG. 5. In this example, the third facet angle ($\theta_3$) is 130±10 degrees relative to the surface of the substrate. The mesa structure 413 in this example may also be described as having an acute facet angle.

Figure 7A:
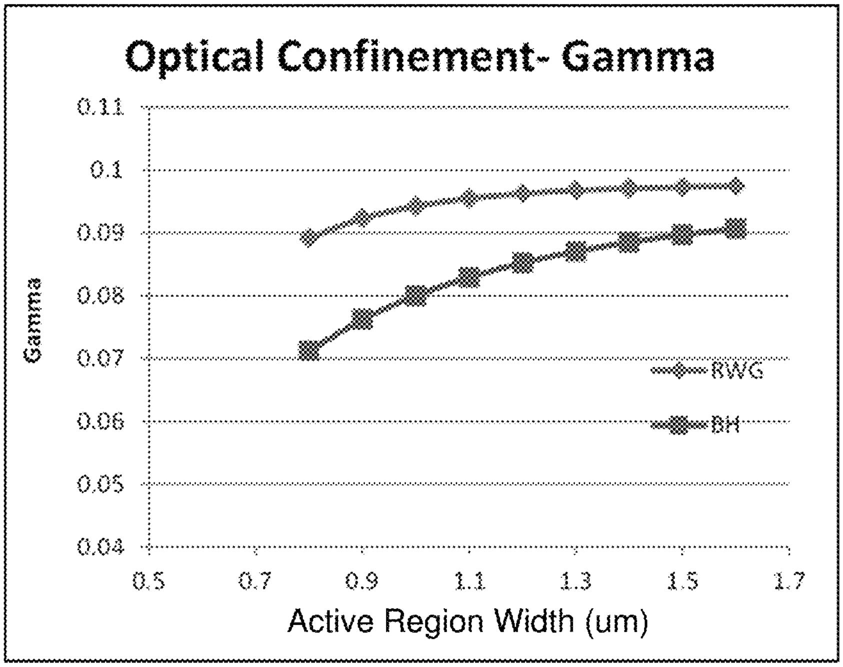
FIG. 7A is a graph that shows how optical confinement changes for a DML relative to mesa width.

FIG. 7A is a graph that shows optical confinement factor gamma relative to active region width (in microns). As shown, a RWG laser consistent with aspects of the present disclosure achieves higher optical confinement relative to a BH laser.

Figure 7B:
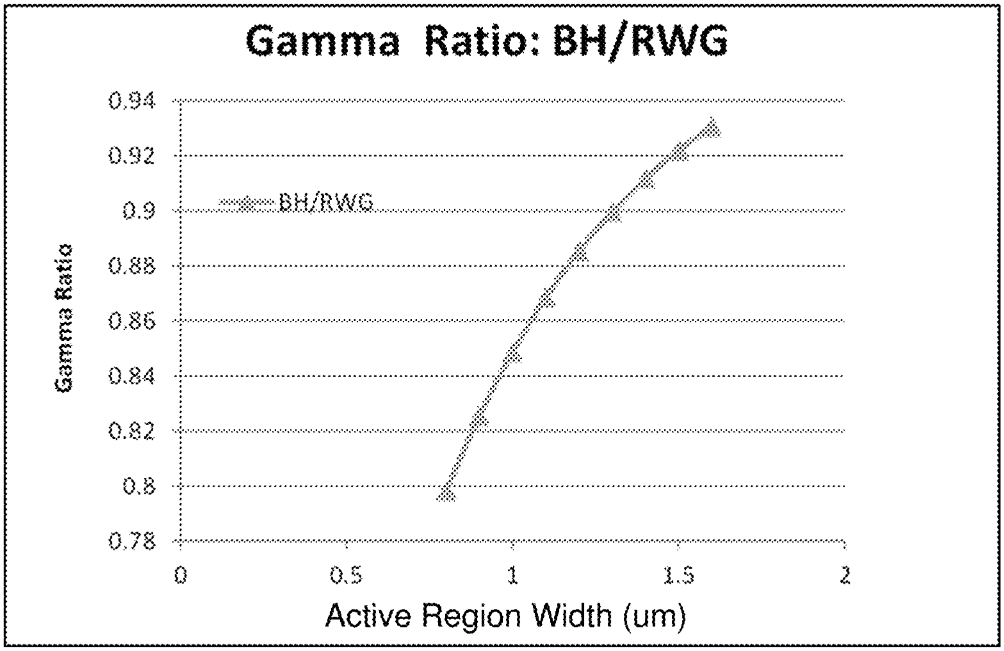
FIG. 7B is a graph that shows an optical confinement change ratio of BH to RWG DML relative to mesa width.

FIG. 7B is a graph that shows gamma ratio relative to active region width (in microns). FIG. 7B thus illustrates that an RWG is more preferable for narrow mesa in terms of the relatively high optical confinement.

Figure 8:
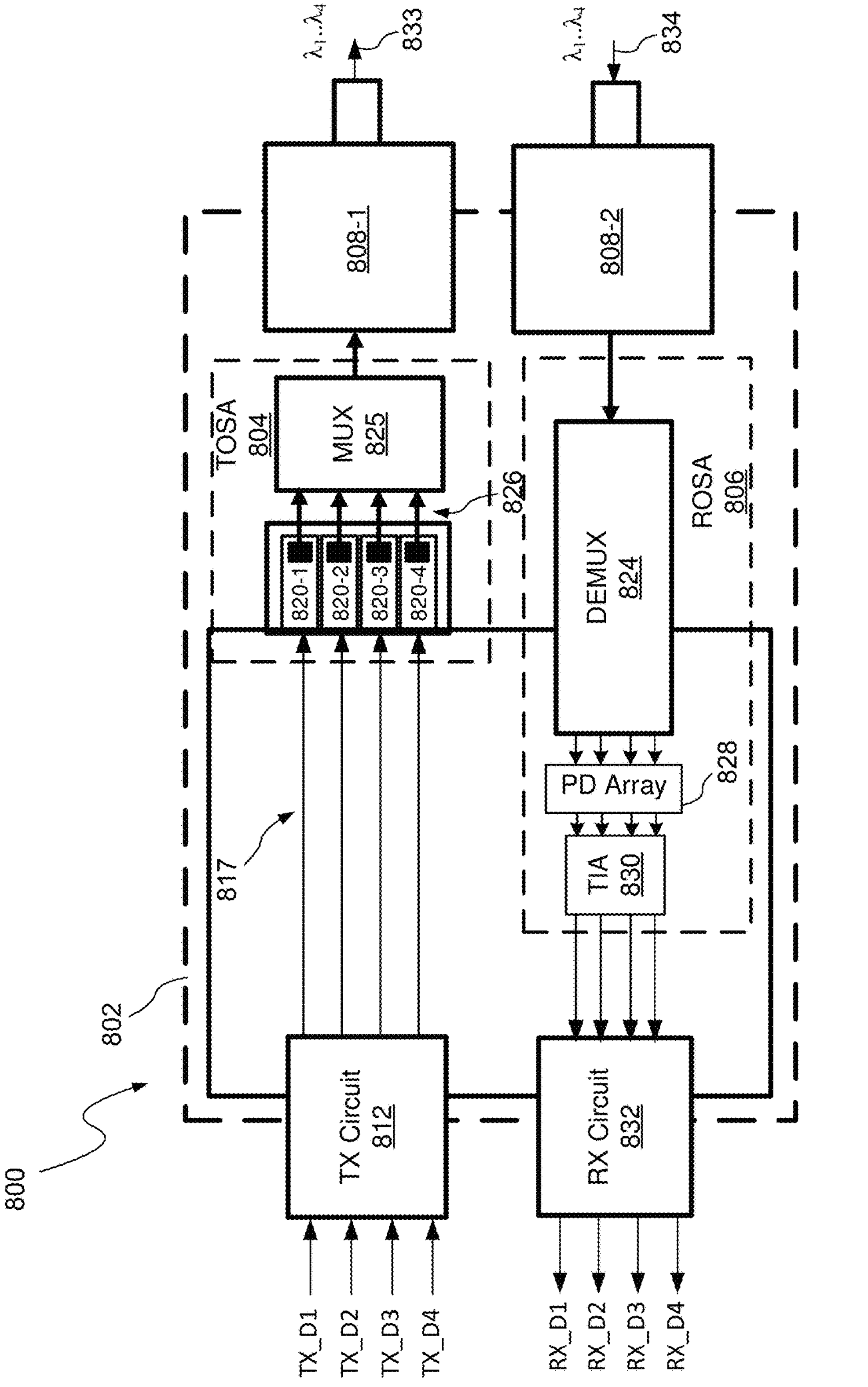
FIG. 8 shows an example multi-channel optical transceiver consistent with aspects of the present disclosure.

A DML consistent with the present disclosure may be implemented in a wide variety of optical subassemblies such as optical transmitters and transceivers. For example, and as shown in FIG. 8, an optical transceiver system 800, consistent with aspects of the present disclosure is shown. As shown, the optical transceiver system 800 transmits and receives four (4) channels using four different channel wavelengths (λ1, λ2, λ3, λ4) and may be capable of transmission rates of at least about 25 Gbps per channel. In one example, the channel wavelengths λ1, λ2, λ3, λ4 may be 1270 nm, 1290 nm, 1310 nm, and 1330 nm, respectively. Other channel wavelengths are within the scope of this disclosure including those associated with local area network (LAN) wavelength division multiplexing (WDM) and fiber to the home (FTTH). The optical transceiver system 800 may also be capable of transmission distances of 2 km to at least about 20 km. The optical transceiver system 800 may be used, for example, in internet data center applications or fiber to the home (FTTH) applications.

Preferably, the optical transceiver system 800 includes a housing 802. As shown, optical transceiver system 800 includes a transmitter optical subassembly (TOSA) arrangement 804 disposed in the housing 802 and having a plurality of laser arrangements, namely laser arrangements 820-1, 820-2, 820-3 820-4 for transmitting optical signals on different channel wavelengths, and a multi-channel receiver optical subassembly (ROSA) 806 disposed in the housing 802 for receiving optical signals having multiple different channel wavelengths. Each of the plurality of laser arrangement 820-1 to 820-4 preferably implement one or more DMLs consistent with the present disclosure, such as the DML 200 of FIG. 2. Note, the TOSA arrangement 804 can include more or fewer laser arrangements, and not necessarily four (4) as shown.

The multi-channel ROSA 806 may also be referred to herein as a ROSA arrangement. As further shown, the optical transceiver system 800 includes a transmit connecting circuit 812 and a receive connecting circuit 832 that provide electrical connections to the TOSA arrangement 804 and the multi-channel ROSA 806, respectively, within the housing 802. The transmit connecting circuit 812 is electrically connected to the electronic components in each of the laser arrangements 820-1 to 820-4 and the receive connecting circuit 832 is electrically connected to the electronic components (e.g., photodiodes, TIA(s), etc.) in the multi-channel ROSA 806. The transmit connecting circuit 812 and the receive connecting circuit 832 may be flexible printed circuits (FPCs) including at least conductive paths to provide electrical connections and may also include additional circuitry. Preferably, the transmit and receive connecting circuits 812, 832 are implemented at least in part in on a printed circuit board.

The TOSA arrangement 804 preferably electrically couples to the transmit connecting circuit 812 via electrically conductive paths 817 and is configured to receive driving signals (e.g., TX_D1 to TX_D4) and launch channel wavelengths 826 on to fiber(s) of the external transmit optical fiber 833 via multiplexing device 825 and the first optical coupling port 808-1.

Continuing on, the example multi-channel ROSA 806 shown in FIG. 8 includes a demultiplexer 824 optically coupled to the second optical coupling port 808-2 to receive an optical signal having a plurality of multiplexed channel wavelengths via the external receive optical fiber 834. An output of the demultiplexer 824 is optically coupled to a photodiode array 828. The multi-channel ROSA 806 also includes a transimpedance amplifier 830 electrically connected to the photodiode array 828. The photodiode array 828 and the transimpedance amplifier 830 detect and convert optical signals received from the demultiplexer 824 into electrical data signals (RX_D1 to RX_D4) which are output via the receive connecting circuit 832.

In accordance with an aspect of the present disclosure a direct modulated laser (DML) is disclosed. The DML comprising a substrate, one or a plurality of layers disposed on the substrate to provide a multi quantum well (MQW), first and second dielectric structures disposed on the substrate, wherein the first and second dielectric structures are disposed on opposite sides of the MQW, one or a plurality of layers disposed on the MQW to provide a mesa structure, and wherein the mesa structure is disposed between the first and second dielectric structures.

In accordance with an aspect of the present disclosure an optical subassembly is disclosed. The optical subassembly comprising at least one direct modulated laser (DML) for emitting a predetermined channel wavelength, the at least one DML comprising a substrate, a multi quantum well (MQW) formed on the substrate, a mesa structure disposed on the MQW for receiving a driving current, first and second dielectric structures disposed on opposite sides of the mesa structure to provide a dielectric current confinement ridge waveguide (RWG) structure, and wherein a width of the mesa structure is greater than an overall width of the MQW.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A direct modulated laser (DML), the DML comprising:

a substrate;

a plurality of layers disposed on the substrate to provide a multi quantum well (MQW);

first and second dielectric structures disposed on the substrate, wherein the first and second dielectric structures are disposed on opposite lateral sides of the MQW, wherein each of the first and second dielectric structures include a base with a first overall width in a horizontal direction and a vertical section that extends from the base in a vertical direction, the vertical section having a second overall width in the horizontal direction, the first overall width of the base being greater than the second overall width of the vertical section such that an inner portion of each base extends inwards from the vertical section and an outer portion of each base extends outwards from the vertical section;

one or a plurality of layers disposed on the MQW to provide a mesa structure, wherein an overall width of the mesa structure in a horizontal direction is greater than an overall width of the MQW in the horizontal direction, wherein the inside portion of the base of each of the first and second dielectric structures underlies and supports the mesa structure; and wherein the MQW is disposed between the bases of the first and second dielectric structures and the mesa structure is disposed between the vertical sections of the first and second dielectric structures to provide dielectric current confinement.

2. The DML of claim 1, wherein the overall width of the mesa structure is in a range of 1.2 to 2.5 microns in a horizontal direction.

3. The DML of claim 1, wherein the overall width of the mesa structure is 1.8±0.5 microns in the horizontal direction.

4. The DML of claim 1, wherein the substrate comprises Indium Phosphide (InP).

5. The DML of claim 1, wherein the substrate comprises Gallium Arsenide (GaAs), Gallium Antimonide (GaSb), or Indium Arsenide (InAs).

6. The DML of claim 1, wherein the plurality of layers forming the MQW is a type III-V semiconductor material.

7. The DML of claim 1, wherein the vertical section of each of the first and second dielectric structures extend from the respective base to an overall height in a range of 1.6 to 2.5 microns in the vertical direction.

8. The DML of claim 1, wherein the MQW has the overall width in a range of 0.7 to 1.5 microns in a horizontal direction.

9. The DML of claim 1, wherein the MQW has an overall length in a range of 100 to 300 microns in a horizontal direction.

10. The DML of claim 1, further comprising first and second sidewall passivation layers disposed on opposite sides of the MQW and between the MQW and the bases of the first and second dielectric structures.

11. The DML of claim 1, further comprising a lower cladding disposed on the substrate, beneath the MQW, and between the bases of the first and second dielectric structures.

12. The DML of claim 1, further comprising a cap disposed on the mesa structure and on the vertical sections of the first and second dielectric structures.

13. The DML of claim 12, further comprising a contact layer disposed on the cap.

* * * * *